US011840099B2

(12) United States Patent
Park

(10) Patent No.: US 11,840,099 B2
(45) Date of Patent: Dec. 12, 2023

(54) INKJET PRINT SYSTEM AND INKJET PRINTING METHOD USING THE SAME

(71) Applicant: STI CO., LTD., Anseong-si (KR)

(72) Inventor: Ki Woong Park, Pyeongtaek-si (KR)

(73) Assignee: STI CO., LTD., Anseong-si (KR)

( * ) Notice: Subject to any disclaimer, the term of this patent is extended or adjusted under 35 U.S.C. 154(b) by 0 days.

(21) Appl. No.: 17/865,005

(22) Filed: Jul. 14, 2022

(65) Prior Publication Data
US 2023/0095954 A1 Mar. 30, 2023

(30) Foreign Application Priority Data

Sep. 30, 2021 (KR) .................. 10-2021-0130044

(51) Int. Cl.
B41J 2/21 (2006.01)
B41J 11/00 (2006.01)
B41J 25/308 (2006.01)

(52) U.S. Cl.
CPC .................................. B41J 25/308 (2013.01)

(58) Field of Classification Search
CPC ...... B41J 11/0015; B41J 25/308; B41J 2/2114
See application file for complete search history.

(56) References Cited

U.S. PATENT DOCUMENTS 10,173,419 B2 * 1/2019 Sakurada ............. B41J 2/04581
2021/0300033 A1 * 9/2021 Kondo ................. B41J 2/04551

FOREIGN PATENT DOCUMENTS

KR 10-2019-0090108 8/2019
WO WO-2010001974 A1 * 1/2010 ............ B41J 2/0456

OTHER PUBLICATIONS

Iguchi, MachinetranslationofWO-2010001974-A1, 2010 (Year: 2010).*

* cited by examiner

Primary Examiner — Scott A Richmond
(74) Attorney, Agent, or Firm — KILE PARK REED & HOUTTEMAN PLLC

(57) ABSTRACT

Disclosed are an inkjet print system and an inkjet printing method using the same. An inkjet print system according to one embodiment of the disclosure may include a stage on which a printing medium is loaded and which moves the printing medium in a first direction, an inkjet head which moves in a second direction perpendicular to the first direction and in which a plurality of nozzles configured to eject an ink on the printing medium are formed, a measurement instrument which moves in the second direction independent of the inkjet head and measures a height for each section of an impacted coating layer on the printing medium, and a processor which allows the nozzles to be opened or closed on the basis of height information of the coating layer.

7 Claims, 11 Drawing Sheets

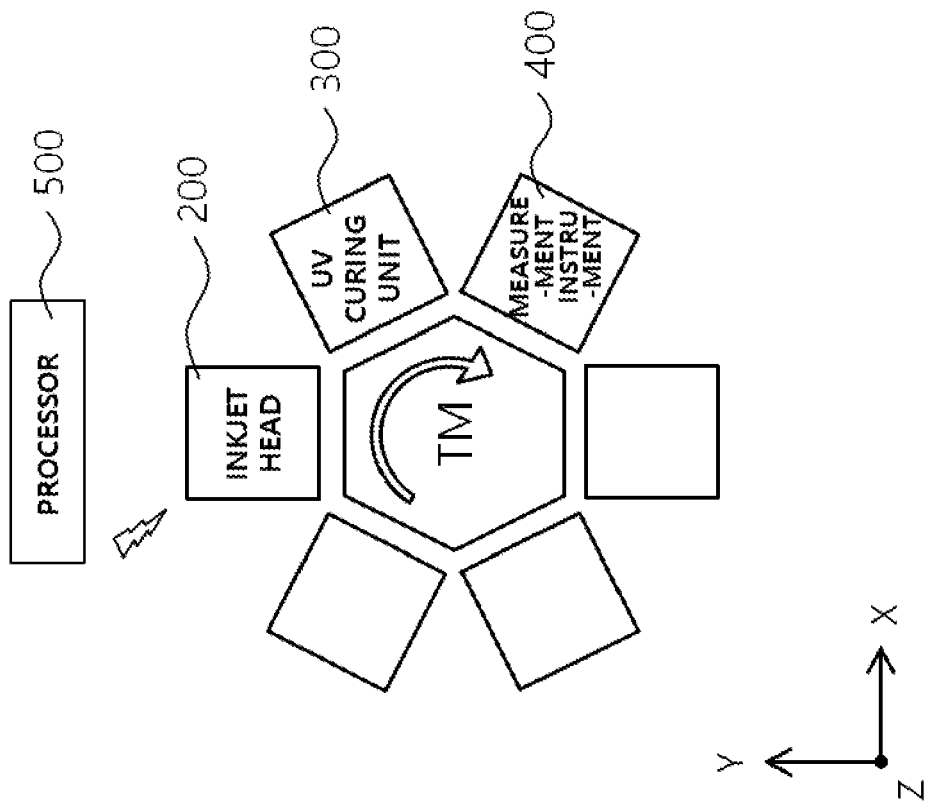
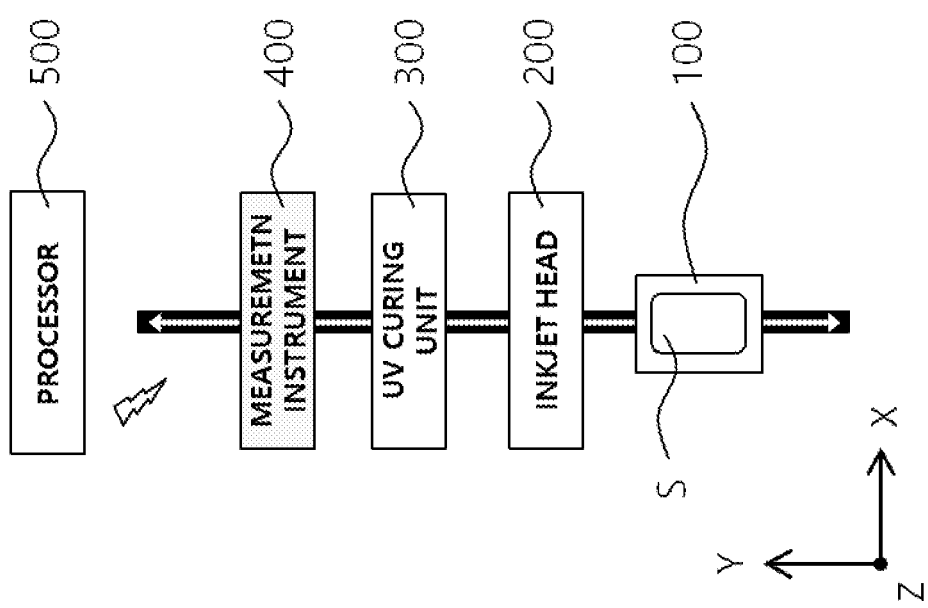

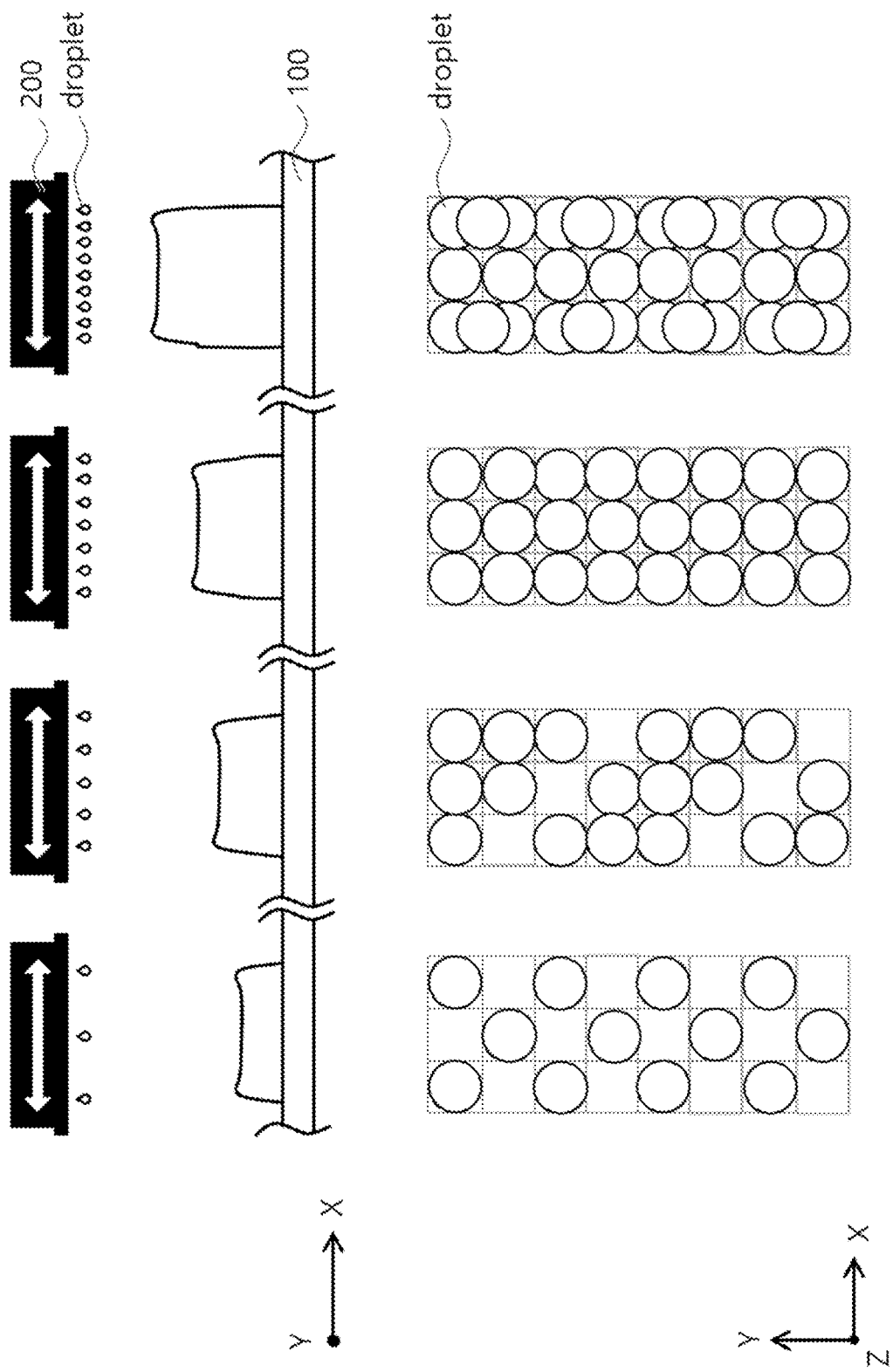

FIG. 4A 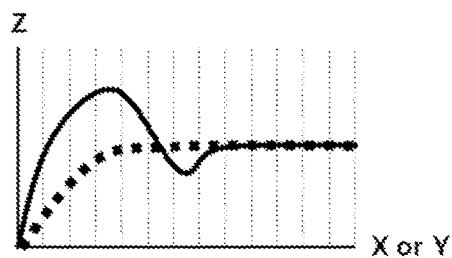 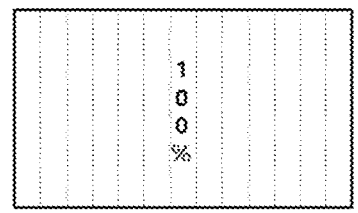
FIG. 4B 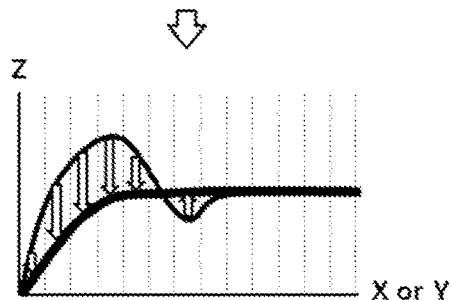 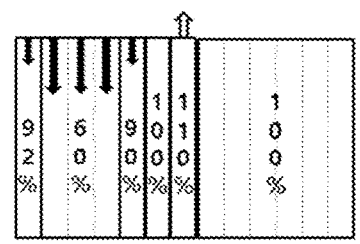
FIG. 4C 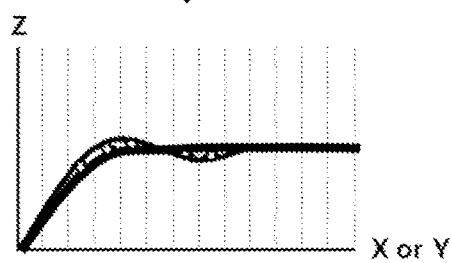 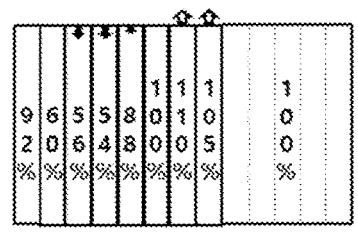
FIG. 4D 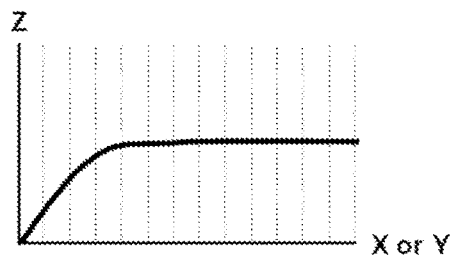 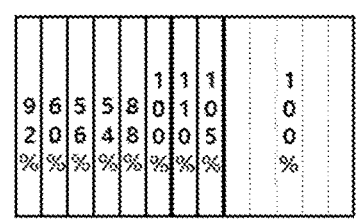

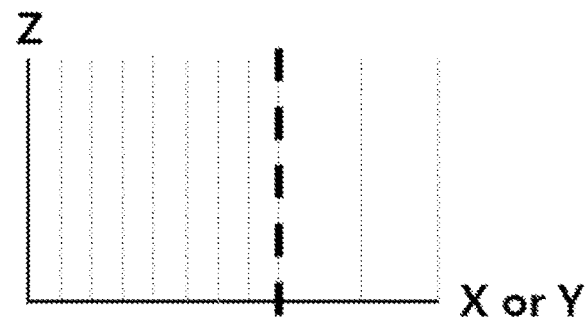
FIG. 5A
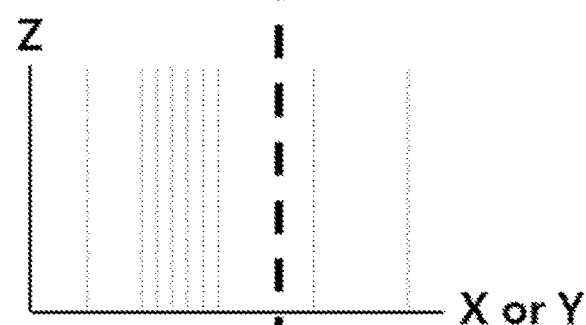
FIG. 5B
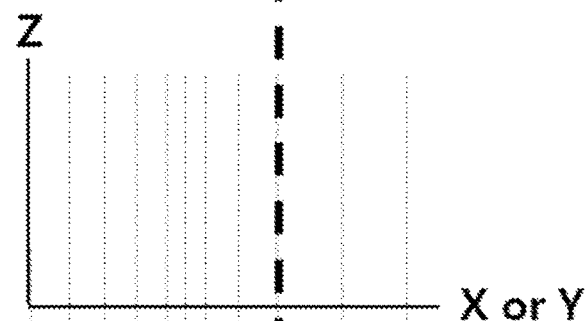
FIG. 5C
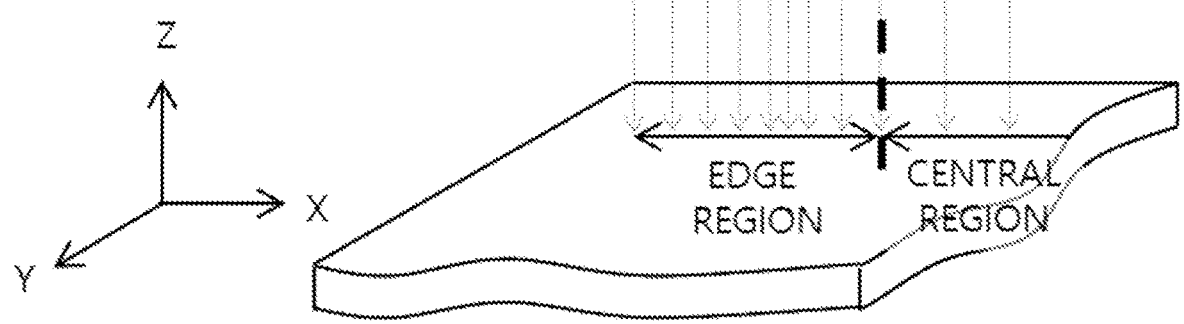

FIG. 6
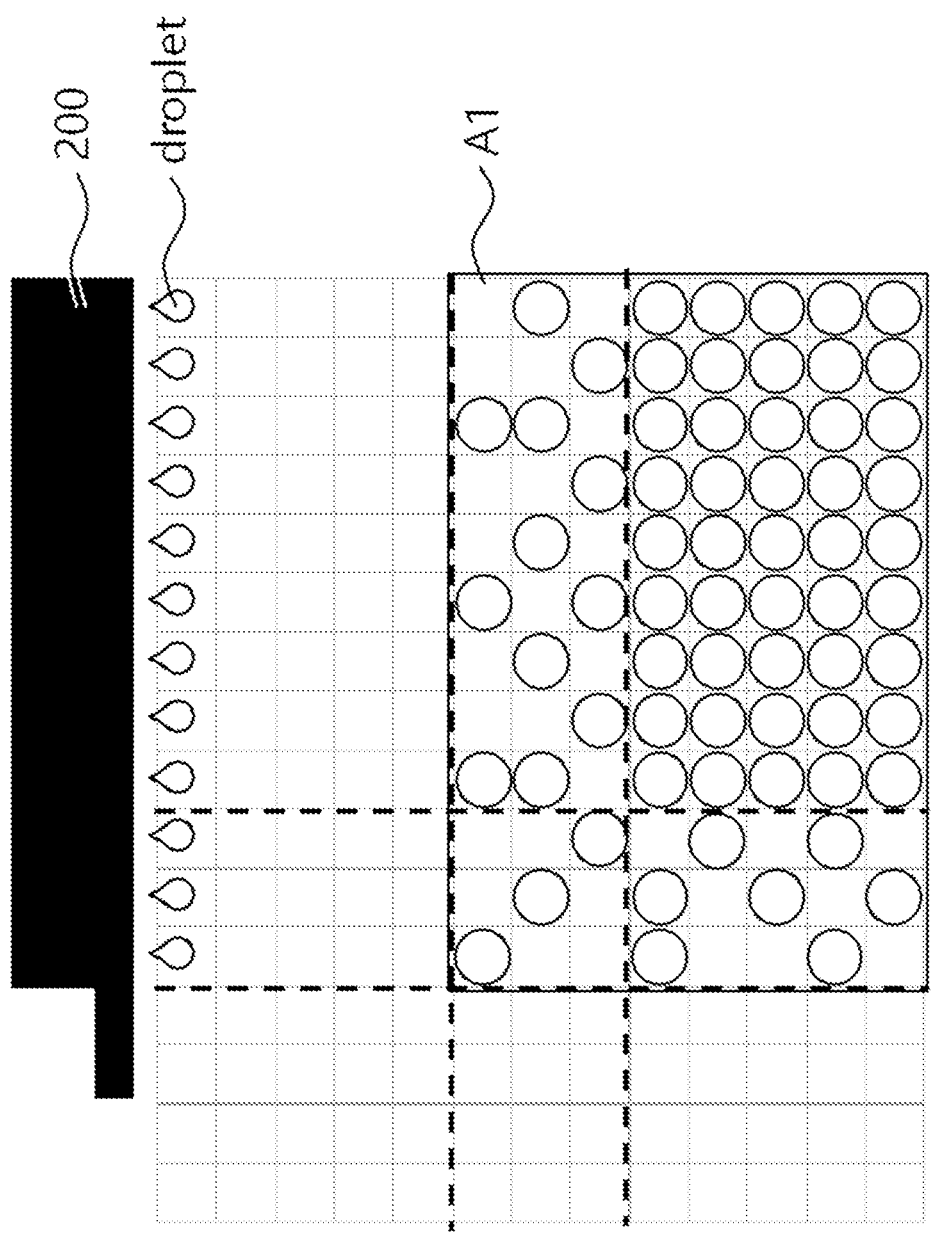
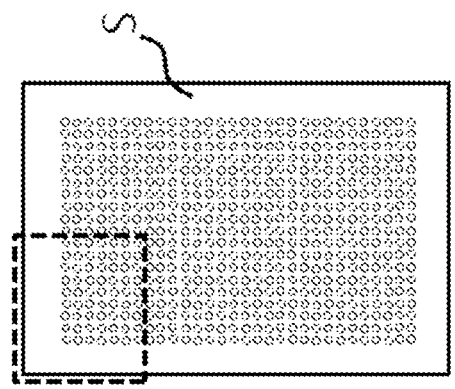

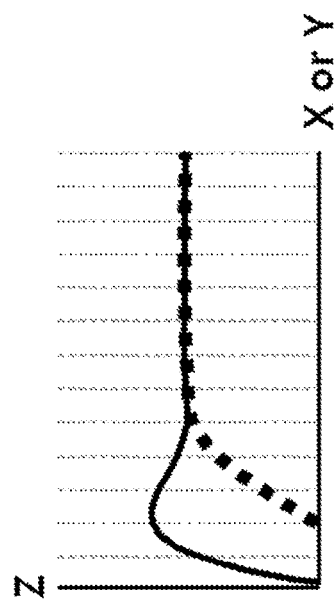
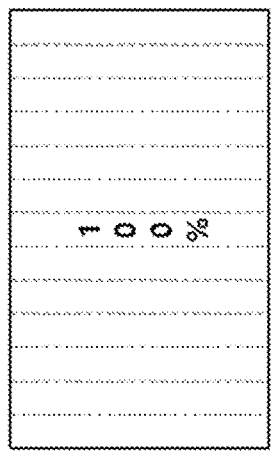
FIG. 8A
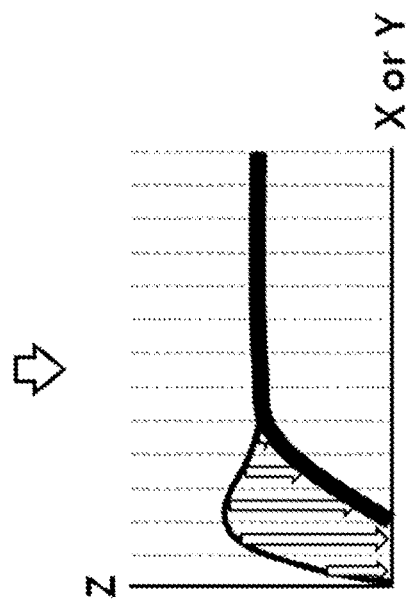
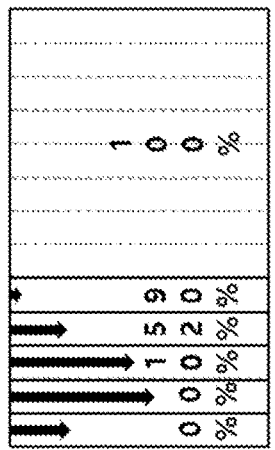
FIG. 8B
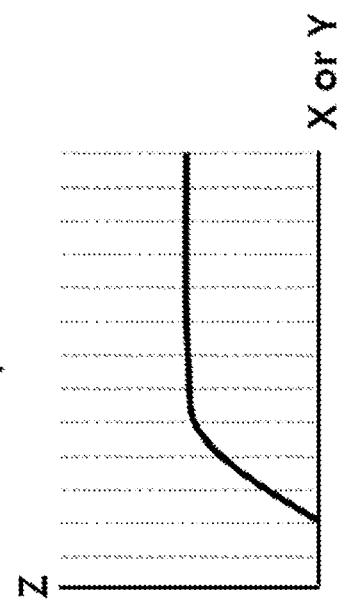
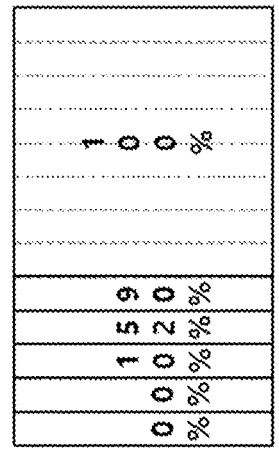
FIG. 8C

INKJET PRINT SYSTEM AND INKJET PRINTING METHOD USING THE SAME

CROSS-REFERENCE TO RELATED APPLICATION

This application claims priority to and the benefit of Korean Patent Application No. 2021-0130044, filed on Sep. 30, 2022, the disclosure of which is incorporated herein by reference in its entirety.

BACKGROUND

1. Field of the Invention

The disclosure relates to an inkjet print system and an inkjet printing method using the same, and more specifically, to an inkjet print system using an inkjet print head and an inkjet printing method using the same.

2. Discussion of Related Art

As inkjet technologies have developed, the inkjet technologies have been used in various fields in which not only text and the like are printed on paper, but ink droplets and the like are also ejected to form thin films or patterns to be used in manufacturing processes of electronic components or display devices.

In a manufacturing process, a material is turned into ink, and fine droplets are ejected and impact on a printing medium at desired positions to form a predetermined coating layer.

The ink used in the manufacturing process is cured by ultraviolet light or heat, and a liquid state is maintained at room temperatures. After the ink impacts on the printing medium, the ultraviolet light or heat is applied to the ink to cure the coating layer.

In such a series of processes of forming the coating layer, there is a problem of a difficulty to form a desired coating layer through inkjet printing due to various factors such as non-uniform ejection in an ejecting process, deformation such as ink spread, smear, and the like because of fluidity of the ink before a curing process is performed, and curing contraction in the curing process.

RELATED ART

Patent Document (Patent Document 0001) Korean Publication No. 10-2019-0090108 (Date of Publication: Aug. 1, 2019)

SUMMARY OF THE INVENTION

The disclosure is directed to providing an inkjet print system capable of forming a coating layer having a desired shape on a printing medium and an inkjet printing method using the same.

The disclosure provides an inkjet print system in order to solve the technical problem.

According to an aspect of the disclosure, there is provided an inkjet print system including a stage on which a printing medium is loaded and which moves the printing medium in a first direction, an inkjet head which moves in a second direction perpendicular to the first direction and in which a plurality of nozzles configured to eject an ink on the printing medium are formed, a measurement instrument which moves in the second direction independent of the inkjet head and measures a height for each section of an impacted coating layer on the printing medium, and a processor which allows the nozzles to be opened or closed on the basis of height information of the coating layer.

The processor may include a sectional ink ejection amount adjustment module which adjusts an ejection amount of the ink for each section of the printing medium.

The processor may further include a section division module which divides an edge region of the printing medium into two or more sections in the second direction.

The processor may include an ink ejection starting position adjustment module which adjusts an ink ejection starting position.

The disclosure provides an inkjet printing method in order to solve the technical problem.

According to another aspect of the disclosure, there is provided an inkjet printing method including a measurement operation of measuring a height of an ink impact on a first printing medium and an ink ejection control operation allowing a nozzle, which ejects the ink on a second printing medium, to be opened or closed on the basis of the height of the impact ink.

The ink ejection control operation may include a height comparison operation of comparing measured height information for each section with height reference information and adjusting the height information for each section.

The ink ejection control operation may further include an ink ejection amount adjustment operation of adjusting an ink ejection starting position.

BRIEF DESCRIPTION OF THE DRAWINGS

The above and other objects, features and advantages of the disclosure will become more apparent to those of ordinary skill in the art by describing an embodiments thereof in detail with reference to the accompanying drawings, in which:

FIGS. 1A and 1B are views illustrating inkjet print systems according to one embodiment of the disclosure;

FIGS. 3A to 3D are views showing adjustment degrees of an ejection amount of an ink of a sectional ink ejection amount adjustment module for each section according to one embodiment of the disclosure;

FIGS. 4A to 4D are operational flow diagrams showing an operation flow of a processor according to one embodiment of the disclosure;

FIGS. 5A to 5C are views illustrating sections calculated by the sectional ink ejection amount adjustment module according to one embodiment of the disclosure;

FIG. 6 is a view illustrating printing ejection regions indicating positions at which ejecting is performed on a printing medium according to one embodiment of the disclosure;

FIGS. 8A to 8C are operational flow diagrams showing an operation flow of the processor in FIG. 7;

DETAILED DESCRIPTION OF THE EMBODIMENTS

Hereinafter, embodiments of the disclosure will be described in detail with reference to the accompanying drawings. However, the technical spirit of the disclosure is not limited to the embodiments which will be described in this specification and may be realized in different forms. Further, the embodiments introduced in this specification are provided so that the disclosed content is thorough and complete and the spirit of the disclosure is sufficiently conveyed to those skilled in the art.

In the present specification, when a certain component is described as being present on another component, it means that the component may be directly disposed on another component, or a third component may be interposed therebetween. In addition, in the accompanying drawings, shapes and sizes are exaggerated to effectively describe the technical content.

In addition, although the terms "first," "second," "third," and the like are used herein to describe various elements in the various embodiments of the present specification, these elements should not be limited by these terms. These terms are only used to distinguish a certain element from another element. Accordingly, an element described as a first element in any one embodiment may be described as a second element in another embodiment. The embodiments described and illustrated in this specification include complementary embodiments thereof. In addition, the term "and/or" is used to include at least any one of elements listed therebefore and thereafter.

The singular forms are intended to include the plural forms, unless the context clearly indicates otherwise. In addition, the terms "comprise," "include," or the like specify the presence of features, numbers, steps, operations, elements, or combinations thereof which are described in the specification, but do not preclude the presence or addition of one or more other features, numbers, steps, operations, elements, or combinations thereof. In addition, in this specification, the term "connect" is used to include both indirect and direct connection of a plurality of elements.

In addition, in the following description, when it is determined that detailed descriptions of related well-known functions or configurations unnecessarily obscure the gist of the disclosure, the detailed descriptions thereof will be omitted.

Hereinafter, for the sake of convenience in the description, a first direction corresponds to a Y-axis in an orthogonal coordinate system, a second direction corresponds to an X-axis in the orthogonal coordinate system. In this case, the first direction is perpendicular to the second direction.

Figure 2A:
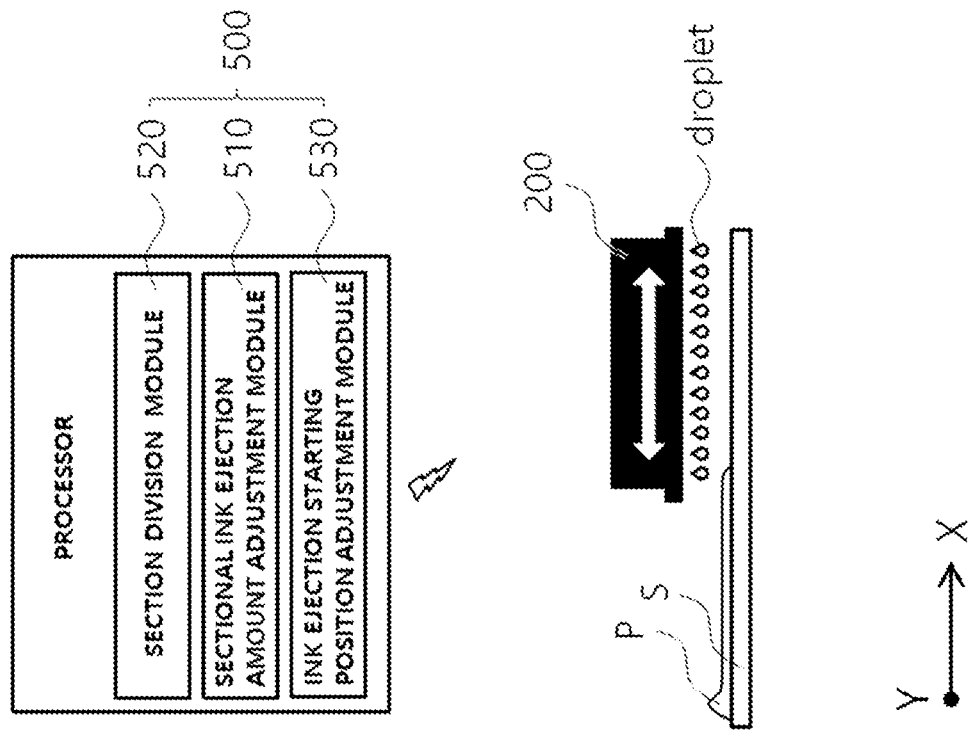
FIG. 2A is a side view illustrating the inkjet print system of FIG. 1A.
Figure 2B:
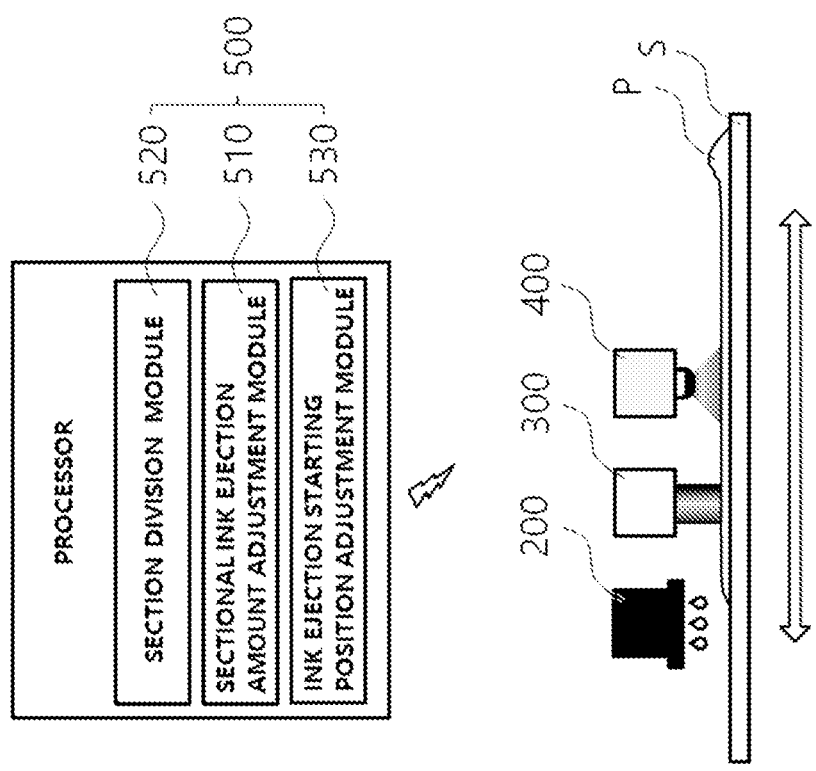
FIG. 2B is a front view illustrating the inkjet print system of FIG. 2A.
Figure 7:
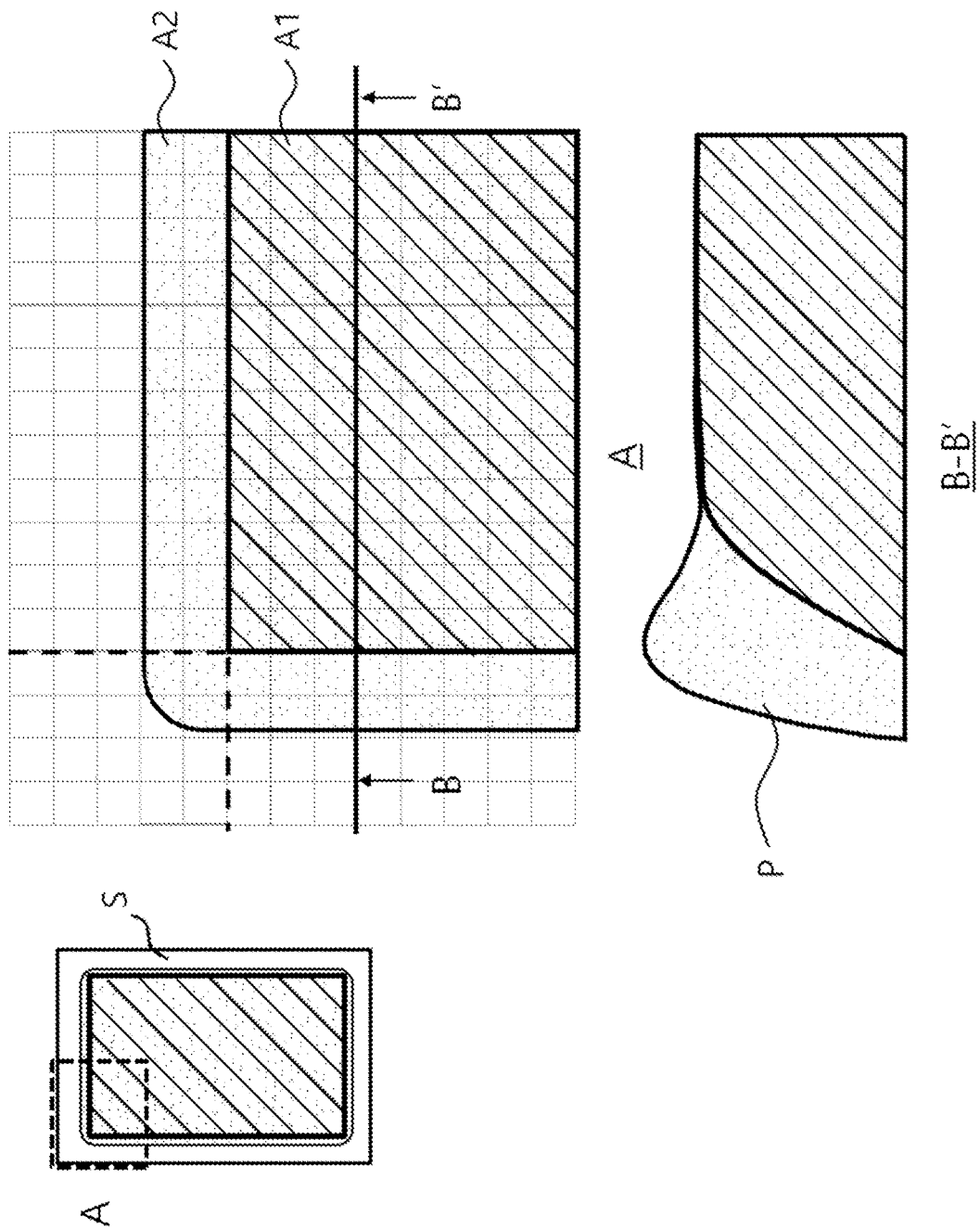
FIG. 7 is a view illustrating a printing medium having a formed printing region which is expanded when compared to a designed printing region according to one embodiment of the disclosure.
Figure 9:
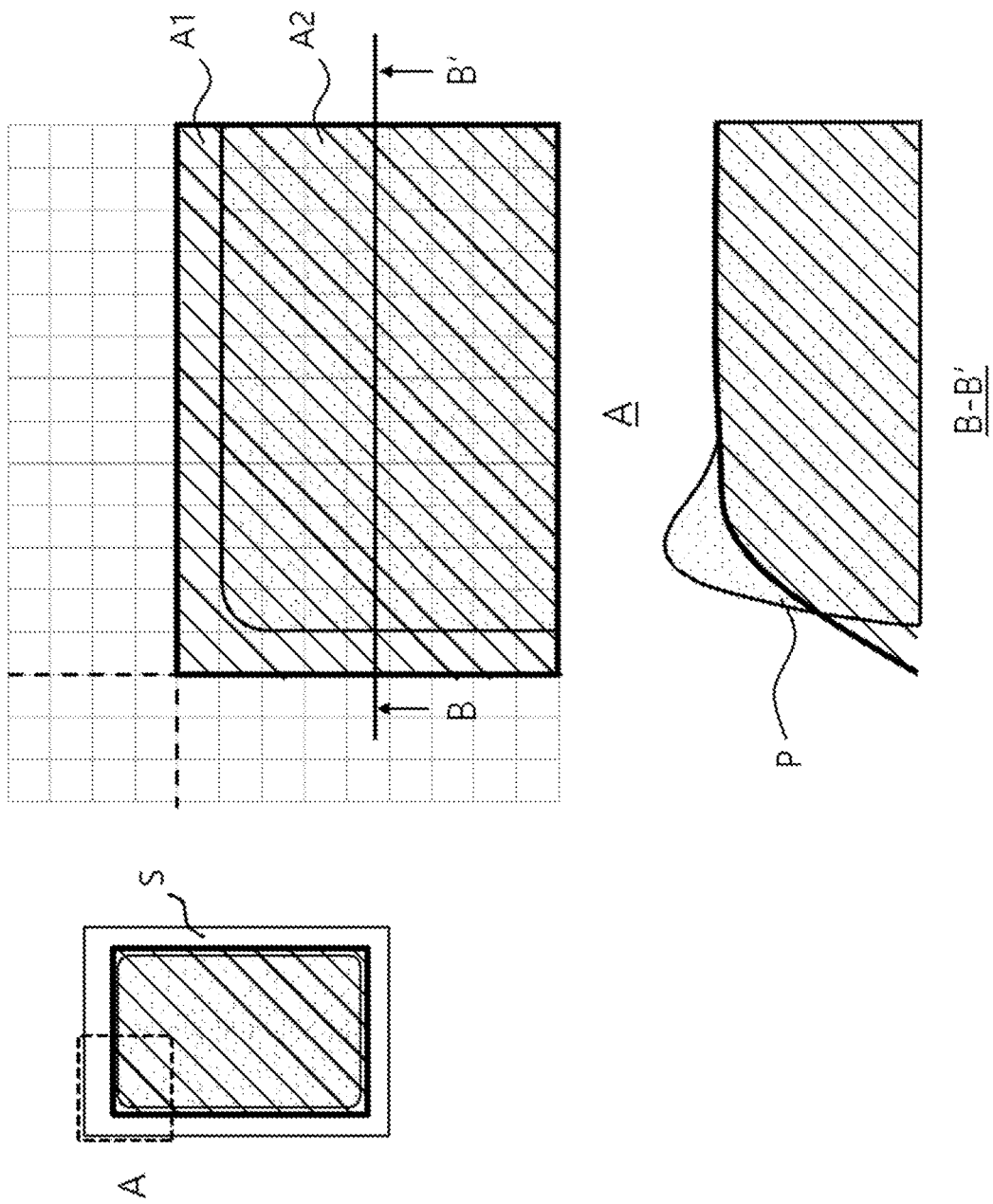
FIG. 9 is a view illustrating a printing medium having a formed printing region which is contracted when compared to a designed printing region according to one embodiment of the disclosure.
Figure 10A:
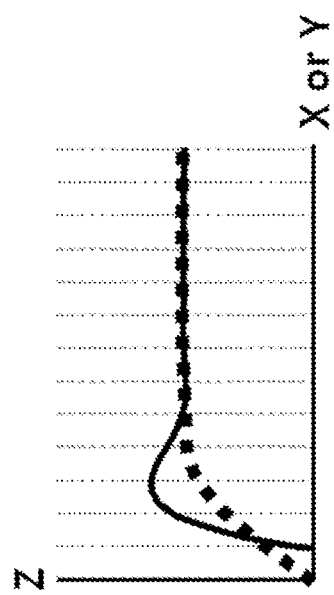
FIGS. 10A to 10C are operational flow diagrams showing an operation flow of the processor in FIG. 9.
Figure 10B:
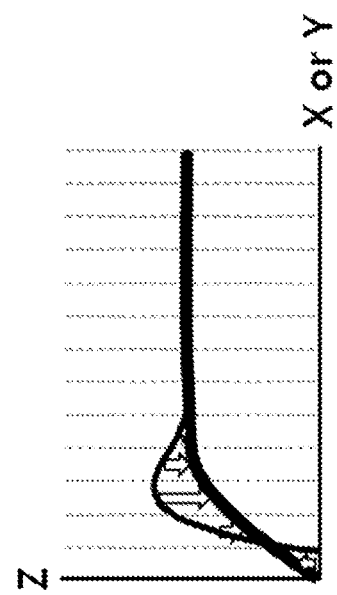
Figure 10C:
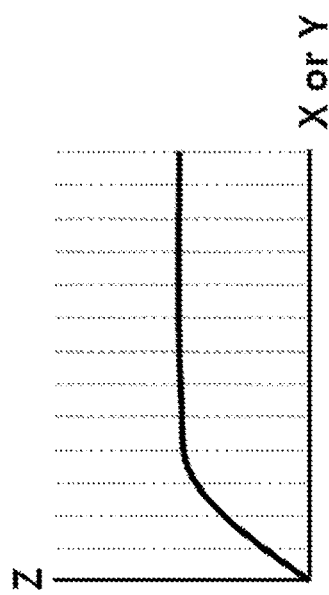

FIGS. 1A and 1B are views illustrating inkjet print systems 10 according to one embodiment of the disclosure. FIG. 2A is a side view illustrating the inkjet print system 10 of FIG. 1A. FIG. 2B is a front view illustrating the inkjet print system 10 of FIG. 2A. FIGS. 3A to 3D are views showing adjustment degrees of an ejection amount of an ink of a sectional ink ejection amount adjustment module 510 for each section according to one embodiment of the disclosure. FIGS. 4A to 4D are operational flow diagrams showing an operation flow of a processor 500 according to one embodiment of the disclosure. FIGS. 5A to 5C are views illustrating sections calculated by the sectional ink ejection amount adjustment module 510 according to one embodiment of the disclosure. FIG. 6 is a view illustrating printing ejection regions indicating positions at which ejecting is performed on a printing medium S according to one embodiment of the disclosure. FIG. 7 is a view illustrating a printing medium S having a formed printing region A2 which is expanded when compared to a designed printing region A1 according to one embodiment of the disclosure. FIGS. 8A to 8C are operational flow diagrams showing an operation flow of the processor 500 in FIG. 7. FIG. 9 is a view illustrating a printing medium S having a formed printing region A2 which is contracted when compared to a designed printing region A1 according to one embodiment of the disclosure. FIGS. 10A to 10C are operational flow diagrams showing an operation flow of the processor 500 in FIG. 9.

Hereinafter, components constituting the inkjet print system 10 according to one embodiment of the disclosure will be described in detail.

Referring to FIGS. 1A, the inkjet print system 10 according to one embodiment of the disclosure may include a stage 100, an inkjet head 200, a measurement instrument 400, and the processor 500. The inkjet print system 10 may form a coating layer P having a desired shape by moving a printing medium S on the stage 100 in a first direction, sequentially ejecting and impacting ink to form a coating layer using the inkjet head 200, and increasing or decreasing an amount of the ink applied on the basis of a measurement value measured by the measurement instrument 400 using the processor 500 for a shape of the coating layer P.

The inkjet print system 10 may be applied to printing processes, such as, an organic printing process of forming red/green/blue (RGB) pixels, a liquid optical clear resin (OCR) printing process, or a penal encapsulation material printing process, which are different from each other as in FIGS. 1A and 1B.

Referring back to FIGS. 1A to 3D, 5A to 7, and 9, the printing medium S may be loaded on an upper surface of the stage 100. The stage 100 may be driven to move the printing medium S in the first direction by a movement driving unit (not shown).

The stage 100 may be controlled to adjust a position of the printing medium S by the processor 500, which will be described below, so that the printing medium S faces any one among the inkjet head 200, an ultraviolet (UV) curing unit 300, and the measurement instrument 400.

Referring back to FIGS. 1A, 3D, and 6, the inkjet head 200 may move in a second direction. The inkjet head 200 may be driven to move to an arbitrary position on a gantry (not shown) in the second direction to face the printing medium S by the head driving unit (not shown).

The inkjet head 200 may eject ink onto the printing medium S. According to one embodiment, the inkjet head 200 may eject the ink while adjusting dots per inch (DPI) according to driving control by the processor 500. In addition, the inkjet head 200 may eject the ink on the basis of printing ejection data. According to another embodiment, a volume of an ink drop and the number of ejections of an ink from the inkjet head 200 may be adjusted for each arbitrary position by the processor 500.

The inkjet head 200 may include the gantry (not shown), several tens or thousands of nozzles (not shown), and an ink supply unit (not shown) disposed on an ink ejection path.

The gantry (not shown) may provide a movement path of the inkjet head 200 in the second direction to be perpendicular to the stage 100.

The nozzles (not shown) may eject an ink of a fine size in a droplet form.

The ink supply unit (not shown) may be installed on the gantry (not shown) or provided in the inkjet head 200.

Referring back to FIGS. 1A and 2A, a UV curing unit 300 may move in the second direction. The UV curing unit 300 may be driven to move to an arbitrary position in the second direction on a gantry (not shown) to face the printing medium S by a curing unit driving unit (not shown). The UV curing unit 300 may be positioned on and supported by one surface of one gantry (not shown) to face the inkjet head 200 disposed on the other surface of the same gantry (not shown) or provided on one gantry (not shown) separated from another gantry (not shown) on which the inkjet head 200 is provided. The UV curing unit 300 may be provided parallel to the inkjet head 200 and independently move in the second direction.

The UV curing unit 300 may cure an impacted ink on the printing medium S. The UV curing unit 300 may perform an ink curing process on the printing medium S independent of an ink ejection process.

Referring back to FIGS. 1A to 2A, the measurement instrument 400 may measure surface shape information of the printing medium S. The measurement instrument 400 may measure height information of the printing medium S and the coating layer P. The measurement instrument 400 may measure the surface shape information of the impacted coating layer P on which the curing process is performed, in which fluidity is lowered, and from which volatile materials are vaporized to minimize deformation thereof.

The measurement instrument 400 may move in the second direction. The measurement instrument 400 may be driven to move to an arbitrary position on a gantry (not shown) in the second direction to face the printing medium S by a measurement instrument driving unit (not shown). The measurement instrument 400 may be provided parallel to the inkjet head 200 and the UV curing unit 300 and independently move in the second direction.

The measurement instrument 400 may scan a surface of the printing medium S. The measurement instrument 400 according to one embodiment may be a displacement sensor. The displacement sensor may obtain height information of the printing medium S and each section of the coating layer P, which is formed by ejecting an ink by the inkjet head 200 and impacting the ink on the printing medium S, based on an arbitrary reference surface.

The measurement instrument 400 may be a contact type or noncontact type measurement instrument. When the measurement instrument 400 according to one embodiment is the noncontact type measurement instrument, the measurement instrument 400 may emit a laser to the surface of the printing medium S and detect a pattern of the laser reflected by the surface of the printing medium S to obtain a three-dimensional (3D) image of the surface of the printing medium S. To this end, the measurement instrument 400 may include a laser emission unit and laser reception unit (not shown) and an image processing unit (not shown).

Referring to FIGS. 1A to 2B, the processor 500 may allow the nozzles (not shown) to be opened or closed on the basis of the height information of the coating layer P. The processor 500 may control an ejection amount of an ink of the inkjet head 200 for the printing medium S on which a next coating layer P is formed on the basis of the height information of the coating layer P formed on the printing medium S.

The processor 500 according to one embodiment may determine an amount of the ink ejected on a second printing medium using a height of each section of a coating layer P of a first printing medium. The processor 500 may calculate a height of each section of the desired coating layer P formed by printing one or more times. The processor 500 may repeatedly perform the calculation several times to calculate an ideal amount of the ink to be ejected.

The processor 500 may include a sectional ink ejection amount adjustment module 510 and further include a section division module 520 and an ink ejection starting position adjustment module 530.

The processor 500 may control a displacement of the stage 100 related to the printing medium S. The processor 500 may change a position of the printing medium S facing the inkjet head 200. To this end, the processor 500 may move a position of the stage 100 on which the printing medium S is loaded in the first direction.

Related to the inkjet head 200, the processor 500 may control a size, an ejection speed, and an impact time of an ink drop, whether the nozzles (not shown) eject the ink drop, and the displacement of the inkjet head 200.

Related to the UV curing unit 300, the processor 500 may control a position, an emission direction, an emitted light intensity, and a curing time of the UV curing unit 300.

Related to the measurement instrument 400, the processor 500 may control a position of the measurement instrument 400 and operation of the measurement instrument 400 and request and receive measurement data from the measurement instrument 400.

The processor 500 may operate the stage 100, the inkjet head 200, the UV curing unit 300, and the measurement instrument 400 in conjunction with each other.

Referring back to FIGS. 4A to 4D and 8A to 8C, the sectional ink ejection amount adjustment module 510 may adjust a sectional ejection amount of an ink for each section on the printing medium S. The sectional ink ejection amount adjustment module 510 may adjust an ejection amount of the inkjet head 200 to increase or decrease for forming the coating layer P. The sectional ink ejection amount adjustment module 510 may request height information for each section of the coating layer P from the measurement instrument 400. The sectional ink ejection amount adjustment module 510 may compare a reference height for each section and the height information.

When the height information is the same as the reference height, the sectional ink ejection amount adjustment module 510 may not adjust an ejection amount so that the inkjet head 200 ejects a set ejection amount of ink on a corresponding section without changing the set ejection amount.

The sectional ink ejection amount adjustment module 510 may adjust printing ejection data to increase or decrease an ejection amount based on the set ejection amount for a printing ejection region of each section. The sectional ink ejection amount adjustment module 510 may calculate an ejection amount to increase or decrease based on the set ejection amount as a percentage (%) thereof. When the height information is higher than the reference height, a jetting rate in a corresponding section may be adjusted to decrease. When the height information is lower than the reference height, a jetting rate in the corresponding section may be adjusted to increase.

Referring back to FIGS. 3A to 3D, the printing ejection region may be calculated on the basis of a jetting rate of the inkjet head 200 per unit area. FIG. 3A is a view showing a coating layer P formed when an ink is ejected at 50% of a reference jetting rate per unit area, FIG. 3B is a view showing a coating layer P formed when the ink is ejected at 75% of the jetting rate per unit area, FIG. 3C is a view showing a coating layer P formed when the ink is ejected at 100% of the jetting rate per unit area, and FIG. 3D is a view showing a coating layer P formed when the ink is ejected at 125% of the jetting rate per unit area.

Again, as illustrated in FIG. 6, when the sectional ink ejection amount adjustment module 510 calculates an ejection amount of ink, a jetting rate may be adjusted at, particularly, an edge region among a central region and the edge region of the printing ejection region on the printing medium S.

Again, as illustrated in FIGS. 3A to 3D and 6, the sectional ink ejection amount adjustment module 510 may selectively open or close the nozzles (not shown) constituting the inkjet head 200 in units of sections. The sectional ink ejection amount adjustment module 510 may control a one-time ejection amount and the number of ejections of the nozzles (not shown) for each section.

The sectional ink ejection amount adjustment module 510 may increase or decrease an ejection amount based on an initial ejection amount for each section. When a height thereof in units of sections is higher than the reference height, the sectional ink ejection amount adjustment module 510 according to one embodiment may adjust an ejection amount to decrease from the set ejection amount. When a height thereof in units of sections is lower than the reference height, the sectional ink ejection amount adjustment module 510 according to another embodiment may adjust an ejection amount to increase or decrease from the set ejection amount.

The section division module 520 may divide the printing medium S into at least two or more sections in the first or second direction. More specifically, the section division module 520 may divide, particularly, the edge region of the printing medium S into two or more sections.

The section division module 520 according to one embodiment may divide the printing medium S at predetermined intervals in one direction.

A section division module 520 according to another embodiment may divide the printing medium S at arbitrary intervals in one direction. More specifically, as illustrated in FIG. 5A, the section division module 520 may divide an edge region and a central region in different ways. In addition, as illustrated in FIGS. 5B and 5C, the section division module 520 may divide the edge region at small intervals and divide an edge peak region thereof at smaller intervals.

Referring back to FIGS. 7 to 10C, the ink ejection starting position adjustment module 530 may adjust an ink ejection starting position. The ink ejection starting position adjustment module 530 may adjust a formed printing region A2 by calculating and adjusting an adjustment parameter which is different from a designed printing region A1.

The designed printing region A1 may be design printing ejection data. The formed printing region A2 may be a coating layer P which is actually formed and measured. The adjustment parameter may include surface energy information of the printing medium, ink characteristic information, curing time information after ejecting, ejection amount information of an ink, and waveform signal information but is not limited thereto.

When the formed printing region A2 is greater than the designed printing region A1, the ink ejection starting position adjustment module 530 according to one embodiment may move the ink ejection starting position in an inward direction of the printing medium S. When a printing region A2 is smaller than a designed printing region A1, the ink ejection starting position adjustment module 530 according to another embodiment may move the ink ejection starting position in an outward direction of the printing medium S.

The printing medium S may be any one of a display panel such as a liquid crystal display (LCD) panel, an organic light emitting diode (OLED) panel, or a plasma display panel (PDP), a touch panel, and a window panel, or may be a panel formed by stacking and coupling the above panels to be multilayered. In addition, the printing medium S may include not only a rigid panel but also a flexible panel formed of a flexible material capable of bending, folding, and rolling.

The printing medium S may be provided under the inkjet head 200, and an ejected ink may impact on the printing medium S to form a coating layer P.

In this case, the ink may be any one of acrylic, epoxy, silicone, and a rubber-based resin or may be a mixture thereof. Preferably, the ink may be a UV curable resin capable of being cured by UV light. The ink may be ejected on the printing medium S to form the coating layer P.

An inkjet printing method according to one embodiment of the disclosure including the above-described components will be described.

Figure 11:
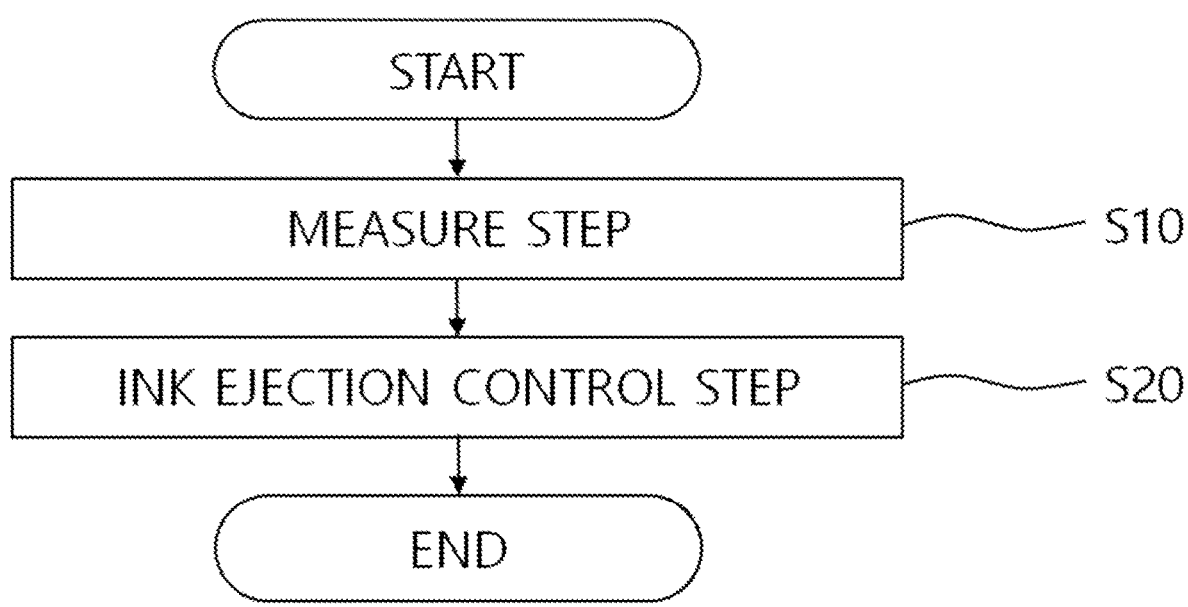
FIG. 11 is a flowchart illustrating an inkjet printing method according to one embodiment of the disclosure.

FIG. 11 is a flowchart illustrating the inkjet printing method according to one embodiment of the disclosure.

Referring to FIG. 11, the inkjet printing method according to one embodiment of the disclosure may further include a measuring operation (S10) and an ink ejection control operation (S20).

In the measurement operation S10, printing medium information, height information of a coating layer, and surface shape information may be measured. In the measurement operation S10, width information of the printing medium, coordinate information for each section, whether there is a coating layer for each section, and the height information of the coating layer for each section may be measured.

The ink ejection control operation S20 may include a height comparison operation S21, an ink ejection data calculation operation S22, and an ink ejection amount adjustment operation S23. Each operation of the ink ejection control operation S20 may be performed one or more times.

In the height comparison operation S21, measured height information for each section may be compared with height reference information, and the height information may be adjusted.

In the ink ejection data calculation operation S22, ink ejection data may be calculated on the basis of the adjusted height information.

In the ink ejection amount adjustment operation S23, an ejection amount of an ink from the inkjet head may be adjusted for each section based on the calculated ink ejection data. In the ink ejection amount adjustment operation S23, an ink ejection starting position may be adjusted.

According to an embodiment of the disclosure, since a processor capable of opening or closing nozzles in units of sections is provided, there is an advantage of forming a coating layer having a desired shape by printing.

According to one embodiment of the disclosure, since a processor increases or decreases an actual amount of an ink applied on the basis of height information of an actually impacted coating layer, there are advantages of improving control capability of forming the coating layer and obtaining the coating layer having a desired shape.

According to another embodiment of the disclosure, since a processor increases or decreases an actual amount of an ink applied on the basis of height information of an actually impacted coating layer obtained by a measurement instrument, there is an advantage of flexibly forming a desired coating layer without changing an apparatus.

According to still another embodiment of the disclosure, since a processor increases or decreases an actual amount of an ink applied on the basis of height information of an actually impacted coating layer obtained by a measurement instrument, there is an advantage of being widely used according to a printing medium, the ink, and specification features of a manufacturing process.

According to yet another embodiment of the disclosure, since a processor increases or decreases an actual amount of an ink applied on the basis of height information of an actually impacted coating layer obtained by a measurement instrument, there is an advantage of satisfying characteristics and quality yield required according to different printing media, ink characteristics, and the like.

Although the disclosure has been described in detail through the embodiments, the scope of the disclosure is not limited to the detailed description but should be interpreted based on the appended claims. In addition, those skilled in the art will understand that many modifications and variations are possible without departing from the scope of the disclosure.

What is claimed is:

1. An inkjet print system comprising:
   a stage on which a printing medium is loaded and which moves the printing medium in a first direction;
   an inkjet head which moves in a second direction perpendicular to the first direction and in which a plurality of nozzles configured to eject an ink onto the printing medium are formed;
   a measurement instrument which moves in the second direction independent of the inkjet head and measures a height for each section of an impacted coating layer on the printing medium; and
   a processor which allows the nozzles to be opened or closed on the basis of height information of the coating layer.

2. The inkjet print system of claim 1, wherein the processor includes a sectional ink ejection amount adjustment module which adjusts an ejection amount of the ink for each section of the printing medium.

3. The inkjet print system of claim 2, wherein the processor further includes a section division module which divides an edge region of the printing medium into two or more sections in the second direction.

4. The inkjet print system of claim 1, wherein the processor includes an ink ejection starting position adjustment module which adjusts an ink ejection starting position.

5. An inkjet printing method comprising:
   a measurement operation of measuring a height of an impacted ink on a first printing medium; and
   an ink ejection control operation allowing a nozzle, which ejects the ink onto a second printing medium, to be opened or closed on the basis of the height of the impacted ink.

6. The inkjet printing method of claim 5, wherein the ink ejection control operation includes a height comparison operation of comparing measured height information for each section with height reference information and adjusting the height information for each section.

7. The inkjet printing method of claim 5, wherein the ink ejection control operation further includes an ink ejection amount adjustment operation of adjusting an ink ejection starting position.

* * * * *